United States Patent [19]

Mukherjee et al.

[11] Patent Number: 5,146,426
[45] Date of Patent: Sep. 8, 1992

[54] ELECTRICALLY ERASABLE AND PROGRAMMABLE READ ONLY MEMORY WITH TRENCH STRUCTURE

[75] Inventors: Satyendranath Mukherjee, Yorktown Heights; Len-Yuan Tsou; Di-Son Kuo, both of New York, all of N.Y.

[73] Assignee: North American Philips Corp., New York, N.Y.

[21] Appl. No.: 610,598

[22] Filed: Nov. 8, 1990

[51] Int. Cl.[5] .................. G11C 13/00; G11C 11/24
[52] U.S. Cl. .................. 365/149; 365/185; 357/23.6
[58] Field of Search .............. 365/185, 149, 218; 357/23.6, 54, 55

[56] References Cited
U.S. PATENT DOCUMENTS

Re. 33,261 7/1990 Baglee .................. 365/149

Primary Examiner—Terrell W. Fears
Attorney, Agent, or Firm—Steven R. Biren

[57] ABSTRACT

An Erasable and Programmable Read Only Memory (EEPROM) cell is provided with an insulated control gate and an insulating floating gate formed in a trench in a semiconductor body. A surface-adjoining drain region is provided alongside an upper portion of a sidewall of the trench, while a source region is provided alongside a lower portion of the trench sidewall, with a channel region extending along the sidewall of the trench between the source and drain regions. The EEPROM cell is programmed by hot electron injection through the sidewall of the trench alongside the channel region, and is erased by Fowler Nordhiem tunneling through a corner region in the bottom of the trench by creating a localized high electric field density in the corner region. In this manner, a highly compact, efficient and durable EEPROM cell is obtained.

10 Claims, 1 Drawing Sheet ered by reference. The EEPROM device described in that patent achieves a smaller surface area than earlier EEPROM devices, while at the same time requiring substantially lower programming and erasing

ELECTRICALLY ERASABLE AND PROGRAMMABLE READ ONLY MEMORY WITH TRENCH STRUCTURE

BACKGROUND OF THE INVENTION

The invention is in the field of Read Only Memory (ROM) devices, and relates specifically to Electrically Erasable and Programmable Read Only Memory (EEPROM) devices.

EEPROM devices in general, and methods for making such devices, are well known in the art. Typically, an EEPROM structure has a floating gate and a control gate, both of which are typically fabricated out of polycrystalline silicon doped with an appropriate doping material to render the polycrystalline conductive. A typical doping material is phosphorus.

The floating gate is separated from a substrate region by a gate dielectric layer of insulating material such as silicon dioxide, while the substrate region includes source and drain regions with a channel region therebetween. The floating gate and the control gate are separated by an intergate dielectric, typically silicon dioxide. The basic principle upon which EEPROM devices operate is that charge is stored on the floating gate in a capacitive manner and can subsequently be electrically erased.

The typical write or erase voltage, i.e. the voltage which is needed to place charge on or to remove charge from the floating gate, has typically been high, i.e. in excess of 20 volts. In turn, this places shrinkage limits on gate oxide thickness of control transistors, junction depth and die size.

Silicon nitride ($Si_3N_4$) has also been used in an insulating layer of a dual dielectric (thermal oxide with silicon nitride on it) between the floating gate and the control gate. Silicon nitride has the property that it is more dense than silicon dioxide, and, therefore, affords higher capacitive coupling between the floating gate and the control gate. A typical dual dielectric between the floating gate and the control gate is composed of 500 angstroms or less oxide and 400 angstroms or less nitride. However, even with the use of silicon nitride as the insulating layer, the write and erase voltage is still relatively high, typically in excess of 18 volts. High erase and program voltages for conventional EEPROM devices are a major drawback. Use of such high voltages has required a separate high voltage supply when operating the devices, or the use of special voltage multiplying circuitry within the device to boost the supply voltage to the requisite program and erase levels.

An additional drawback is that earlier EEPROM structures, when used in a memory array, require additional control circuitry to isolate individual storage cells from one another. This increases the device geometry. For example, given the requirement of a control transistor for each EEPROM cell, the equivalent space requirement for early EEPROM cells was about 165 square microns. More recent designs reduced this figure to below 100 square microns, but substantial further reductions were still required.

In order to overcome these disadvantages, a compact EEPROM device using only a single lateral transistor is shown in Mukherjee et al U.S. Pat. No. 4,698,787, incorporated herein by reference. The EEPROM device described in that patent achieves a smaller surface area than earlier EEPROM devices, while at the same time requiring substantially lower programming and erasing voltages. Nevertheless, as integration techniques have advanced, integrated circuit chip densities have continued to grow, and the need has arisen for a still more compact memory cell configuration, as well as for a memory cell which is capable of operating with still lower programming and erasing voltages.

One technique which has been employed to further shrink memory cell size is the provision of the floating gate and the control gate within a trench, so that a portion of the cell geometry is provided in the vertical direction, thus reducing the lateral extent of the memory cell. In U.S. Pat. No. 4,796,228, there is shown a multiple-transistor EEPROM memory cell in which a lateral transistor employs a trench configuration between laterally-disposed source and drain regions, with electron tunneling at the upper surface of the device between doped surface regions and upper corners of the trench. This cell still has several disadvantages, however, including the need for a relatively large area to accommodate the multi-transistor cell configuration, as well as the extra space required because of the lateral configuration of the individual transistors of the memory cell and the need for relatively high programming and erase voltages.

Various trench configurations have also been employed in other types of memory devices, such as Electrically Programmable Read Only Memory (EPROM) devices and the like, as shown, for example, in Japanese Kokai Numbers 1-227477, 61-256673, 62-76563, and 63-36561. However, none of these nonvolatile memory applications with vertical constructions offer efficient means for both electrical programming and electrical erasing, and are thus of limited utility in EEPROM devices.

SUMMARY OF THE INVENTION

It is therefore an object of the present invention to provide an EEPROM device in which programming and erasing functions are efficiently incorporated into a vertical, single-cell device structure of extremely compact size.

It is a further object of the invention to provide an EEPROM device capable of operating at reduced voltage levels, with enhanced endurance (durability), and reliable and efficient operation.

In accordance with the invention, these objects are achieved by a unique EEPROM device configuration which combines the features of compactness, low operating voltage, high endurance, fast access and efficient and reliable operation in a single-cell vertical EEPROM device.

The basic structure of an EEPROM cell in accordance with the invention includes an insulated control gate and an insulated floating gate formed in a trench within a semiconductor body. A surface-adjoining drain region is provided alongside an upper portion of a sidewall of the trench, while a source region is provided alongside the lower portion of the sidewall of the trench, with a channel region extending along the sidewall of the trench between the source and drain regions. The device is programmed through the trench sidewall portion which is adjacent the channel region, and is erased through a corner region in the bottom of the trench by causing a localized high electric field density in the corner region during the erase operation. In a preferred embodiment of the invention, this localized high electric field density is created by spacing the source region and the insulated floating gate closer together at the corner region where erasing is to take place than elsewhere along the sidewalls and floor of the trench.

In this manner a simple, compact and high-performance EEPROM device is obtained.

It should be noted that the Figures are not drawn to scale and that various dimensions and proportions may be exaggerated for improved clarity.

DESCRIPTION OF THE PREFERRED EMBODIMENTS

Figure 1:
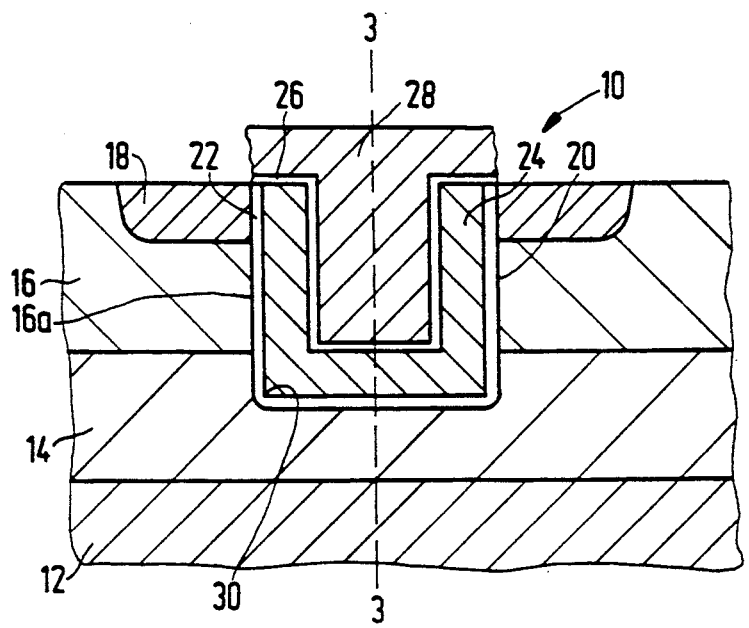
FIG. 1 is a cross-sectional view of an EEPROM device in accordance with the invention.

FIG. 1 of the drawing shows a single-transistor trench Electrically Erasable and Programmable Read Only Memory (EEPROM) cell 10 in accordance with the invention. The device is formed in a semiconductor body having a first semiconductor layer 12 of a first conductivity type (here n type) and a high doping level of about $10^{19}$ at/cm$^3$, and a second semiconductor layer 14 of the first conductivity type on the first layer and having a lower doping level of about $10^{16}$ at/cm$^3$ and a thickness of about 0.5$\mu$. The first layer may either be a buried layer or the substrate of the device, and the first and second layers, taken together, form the source region of the EEPROM cell. A third semiconductor layer 16 of a second conductivity type (here p type) is provided on the second layer and extends to the surface of the device. The thickness of this layer is about 0.6–1.0$\mu$ and its doping level is about $5\times10^{17}$ at/cm$^3$. A fourth surface-adjoining, highly-doped semiconductor layer 18 of the first conductivity type is provided locally in the third layer and forms a drain region of the memory cell. This fourth layer has a doping concentration of about $10^{20}$ at/cm$^3$ and a thickness of about 0.1–0.4$\mu$.

A trench 20 extends through the third and fourth layers 16, 18 and partly into but not through the second layer 14. In this embodiment, it is contemplated that the trench will have a substantially square configuration when viewed from above, but rectangular, circular or other shapes are also possible. A channel region 16a is located in a portion of the third layer 16 adjacent the sidewall portion of the trench and extending in a substantially vertical direction from the source region to the drain region of the device.

The trench sidewalls and floor are covered with a gate dielectric 22 formed of an insulating material such as silicon dioxide and having a thickness of about 100 to 200 angstroms. As will be described in further detail hereinafter, the gate dielectric 22 has a localized portion of reduced thickness in a lower corner region 30 of the trench, in the area adjacent the intersection of the trench sidewalls and floor.

A floating gate 24, in this example of polysilicon, is provided on the gate dielectric and extends adjacent the sidewalls and floor of the trench, as shown in FIG. 1. The interior portions of the floating gate 24 are covered by an intergate dielectric 26, which may be formed of a layer of silicon dioxide or silicon dioxide and silicon nitride having a thickness of about 200 angstroms. The basic structure of the device shown in FIG. 1 is completed by a control gate 28, typically of polysilicon formed on the intergate dielectric 26 and extending within the trench 20 to about the same depth as the third layer 16, with the control gate 28 being separated from the channel region 16a by floating gate 24, gate dielectric 22 and intergate dielectric 26.

Figures 2A, 2B, 2C:
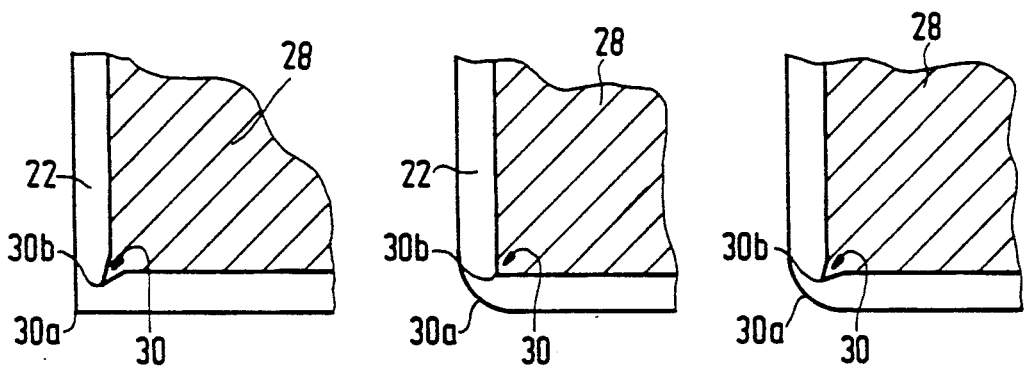
FIGS. 2a, 2b and 2c are enlarged partial cross-sections of alternate embodiments of the lower corner region of the trench shown in the embodiment of FIG. 1.

FIGS. 2a, 2b, and 2c show enlarged partial cross-sections of three alternate configurations for the lower corner region 30 of the trench. In each case, the object is to form a corner region where a localized high electric field density occurs during an erase portion of the operating cycle of the cell. This is accomplished by providing the gate dielectric with a localized portion of reduced thickness at the corner region 30. In the embodiment shown in FIG. 2a, the reduced thickness is achieved by providing the gate dielectric 22 with a substantially squared off outer corner contour 30a and a "notched" inner contour 30b, while in FIG. 2b the outer contour 30a at the corner region 30 is rounded, while the inner edge of the gate dielectric 30b is substantially squared off. Finally, the thickness of the corner region can be reduced by providing both a rounded outer edge 30a and a "notched" inner edge 30b at the corner region 30, as shown in FIG. 2c. The degree of thinning in the corner region may be chosen based upon desired operating characteristics, but it has been found that a thickness of between about 30% to 90% of the thickness of the remaining portions of the gate dielectric 22 is generally advantageous. Thus, for an overall gate dielectric thickness in the range of 100–200 angstroms, the thickness of the localized portion at the corner region will be between about 30 angstroms and about 180 angstroms.

Figure 3:
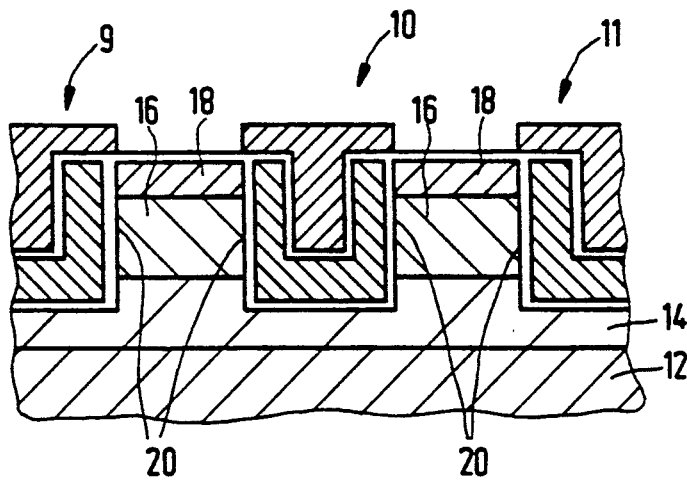
FIG. 3 shows in cross-section a plurality of interconnected EEPROM cells in accordance with the invention taken along the section line 3—3 in FIG. 1.

In FIG. 3 there is shown an EEPROM device 10 such as that shown in FIG. 1 interconnected with similar adjacent cells 9 and 11, viewed along the section line 3—3 in FIG. 1. In this view it can be seen that the device construction is generally symmetrical to that shown in FIG. 1, with like regions being provided with like reference numerals for ease of identification. However, it is important to note that the drain region 18, which extends only locally around the trench 20 in FIG. 1, extends in the orthogonal view of FIG. 3 completely across to the trench sidewall of the next adjacent EEPROM cell 9 or 11. In this manner, the surface-adjoining region 18 additionally forms the drain region for each adjacent cell as well as an integral interconnection between the cells. In this manner a simple and highly efficient configuration is achieved, in which bit-line continuity is provided by region 18, thus eliminating the need for separate metalization and drain contacts at each cell. This results in a substantial simplification in the overall device structure as well as a significant reduction in cell size.

The structural features described above afford several unique performance and fabrication advantages over prior-art EEPROM devices. For example, by thinning the gate dielectric in just the trench corners, electrical erasing by tunneling can occur at lower voltages than would otherwise be the case. For example, erasing can easily occur below 10 volts and an erase voltage of as low as 4–5 volts is feasible. In prior-art lateral devices, such as those shown in U.S. Pat. No. 4,698,787, it would be necessary to thin the entire gate dielectric in order to achieve this advantage, and that would result in manufacturability problems in terms of yield and reproducibility. Furthermore, thinning the entire gate dielectric would also adversely affect endurance (i.e. the number of write and erase operations that can be performed before the cell is unusable), because charge trapping within the thin dielectric in the channel area would degrade performance relatively rapidly as a result of repeated tunneling though the thin dielectric material. In the present invention, to the contrary, tunneling occurs in the lower corner regions 30, which are intentionally located away from the channel region 16a, thus permitting a thinner oxide for optimum tunneling at the corner region while preserving optimum gate dielectric thickness over the channel. Additionally, the erase process is further enhanced, and the permissible erase voltage further lowered, by the localized high electric field caused by the sharp corner region.

The provision of a dual-layer source region, comprising the lightly-doped layer 14 and the underlying, more heavily-doped layer 12 results in minimal leakage current across the source-channel junction as the source voltage is increased. Minimization of leakage is important because such leakage can severely limit erase capability due to loading, particularly if the common practice of using a charge-pump circuit to generate erase voltage is employed. Additionally, the presence of the highly-doped underlying layer 12 helps to reduce the resistance of the source region. This is important during the read operation, when any voltage drop across the source region will reduce the "on" current, thereby reducing the access speed of the memory cell.

Another important feature of the present invention is the provision of an overlap in the vertical direction between layer 14 of the source and the lower portion of the trench sidewall. This overlap region controls the coupling between the source and the gate regions, and also permits the separation of the channel region from the corner area 30 where tunneling occurs during the erase operation. This separation serves to enhance cell endurance by preventing channel degradation due to charge trapping in the dielectric during tunneling that would otherwise occur. In the embodiment shown, the overlap distance in the vertical direction can vary from about 0.1 micron up to 0.5 micron or more. In general, as the overlap increases, isolation of the tunneling region is increased, but source resistance is also increased, so that the ultimate selection of an overlap distance is a trade-off between these two parameters.

Additionally, structures in accordance with the present invention provide a significantly improved packing density as compared to existing lateral EEPROM memory cells. Density can be improved by at least a factor of two and memory cells have already been fabricated with a substantially square (when viewed from above) trench having dimensions of 0.7 micron by 0.7 micron. This translates into a completed cell size of less than about 1.5 micron by 1.5 micron, with further reduction possible. Using cells of this size, single chip memory sizes up to 256 Mbit can be achieved, and 0.5 micron lithography is anticipated to yield cell sizes sufficiently small to make memory sizes up to 1 Gbit possible.

Memory cells in accordance with the present invention are programmed by means of hot electron injection from the trench sidewall at the area of the channel region 16a. During the programming process, drain and control gate voltages are high, while source voltage is low, with a typical drain voltage for programming being about 7 volts or less. The erasing operation is conducted by Fowler Nordhiem tunneling from the floating gate 24 to the source at the corner region 30. The erasing operation is conducted with the drain region floating, the source region high, and the control gate low. A typical erase voltage is 12 volts with voltages below 10 volts being possible. With process optimization, operation with a drain voltage as low as about 4 volts with an erase voltage of about 5 volts in envisioned.

Devices in accordance with the present invention can be fabricated using generally standard and well-known process techniques. With respect to the formation of the thinned gate dielectric at the corner region 30, this feature can be fabricated using a variety of techniques. Typically, the trench can be etched to provide either a sharp lower corner region (FIG. 2a) or a rounded corner (FIGS. 2b and 2c). Subsequently, for the case where the gate dielectric is provided of silicon dioxide, the temperature at which oxidation is carried out can be selected to determine the precise contour and degree of thinning at the corner region. At lower temperatures, for example, at 950° C. or less, a sharper thinning contour is obtained, where at higher temperatures, for example at 1050° C. or above, less thinning occurs and the shape of the thinned corner region is more flat. Additionally, a multiple-step oxidation process can be employed using different temperatures in order to precisely tailor the shape of the corner for a particular application.

In summary, the present invention provides an EEPROM cell of simple and compact design, which is capable of operating efficiently at relatively low voltages, can be easily and reproducibility manufactured, has high endurance, fast access, efficiency, reliability and performance, all in an extremely compact configuration which permits the fabrication of high-density memories.

While the invention has been particularly shown and described with reference to several preferred embodiments thereof, it will be understood by those skilled in the art that various changes in form and detail may be made without departing from the spirit or scope of the invention.

We claim:
1. An Electrically Erasable and Programmable Read Only Memory (EEPROM) cell, which comprises:
   a first semiconductor layer of a first conductivity type and having a high doping level;
   a second semiconductor layer of said first conductivity type on said first layer and having a lower doping level than that of said first layer, said first and second layers together forming a source region of said EEPROM cell;
   a third semiconductor layer of a second conductivity type opposite to that of said first type on said second layer and extending to a surface of said EEPROM cell;
   A fourth surface-adjoining highly-doped semiconductor layer of said first conductivity type provided locally in said third layer and forming a drain region of said EEPROM cell;
   a trench extending through said third and fourth layers and partially into but not through said second layer;
   a channel region located in a portion of said third layer adjacent the sidewall portion of said trench and extending from said second region to said fourth region;

a gate dielectric covering a sidewall and floor of said trench;

a floating gate on said gate dielectric and extending adjacent the sidewall and floor of said trench;

an intergate dielectric covering at least an inner sidewall and floor of said floating gate;

a control gate located on said intergate dielectric and separated from said channel region by said floating gate;

means for causing a localized high electric field density during an erase portion of an operating cycle of said cell across a corner region of said gate dielectric in the area adjacent the intersection of said trench sidewall and floor.

2. An EEPROM cell as in claim 1, wherein said means for causing a localized high electric field density comprises providing said gate dielectric with a localized portion of reduced thickness at said corner region.

3. An EEPROM cell as in claim 2, wherein said localized portion of said gate dielectric has a thickness of between about 30% to 90% of the thickness of the remaining portions of said gate dielectric.

4. An EEPROM cell as in claim 3, wherein the thickness of said localized portion of said gate dielectric is between about 30 angstroms and about 180 angstroms.

5. An EEPROM cell as in claim 2, wherein said localized gate dielectric portion of reduced thickness comprises a rounded outer edge at said corner region.

6. An EEPROM cell as in claim 2, wherein said localized gate dielectric portion of reduced thickness comprises a notched inner edge at said corner region.

7. An EEPROM cell as claimed in claim 2, wherein said localized gate dielectric portion of reduced thickness comprises both a rounded outer edge and a notched inner edge at said corner region.

8. An EEPROM cell comprising a semiconductor body, an insulated control gate and an insulated floating gate formed in a trench in said body, a surface-adjoining drain region alongside an upper portion of a sidewall of said trench, a source region alongside at least a lower portion of the side-wall of said trench, a channel region extending along the sidewall of said trench between said source and drain regions, means for programming said cell through said trench sidewall adjacent said channel region, and means for erasing said cell through a corner region in the bottom of said trench by causing a localized high electric field density in said corner region during operation.

9. An EEPROM cell as in claim 8, wherein said source region and said insulated floating gate are more closely spaced at said corner region than elsewhere along said trench.

10. An EEPROM cell as in claim 8, formed in an array of such cells, wherein said surface-adjoining drain region of said cell extends in a lateral direction to contact the sidewall of at least one adjacent cell, said drain region additionally forming the drain region of said adjacent cell and an interconnection between said cell and said adjacent cell.

* * * * *